US009355909B2

(12) United States Patent
Meyer et al.

(10) Patent No.: US 9,355,909 B2
(45) Date of Patent: May 31, 2016

(54) METHOD OF MANUFACTURING AN INTEGRATED CIRCUIT HAVING FIELD EFFECT TRANSISTORS INCLUDING A PEAK IN A BODY DOPANT CONCENTRATION

(71) Applicant: Infineon Technologies AG, Neubiberg (DE)

(72) Inventors: Thorsten Meyer, Munich (DE); Stefan Decker, Munich (DE); Norbert Krischke, Munich (DE); Christoph Kadow, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 12 days.

(21) Appl. No.: 14/148,776

(22) Filed: Jan. 7, 2014

(65) Prior Publication Data
US 2014/0120673 A1    May 1, 2014

Related U.S. Application Data

(62) Division of application No. 12/402,943, filed on Mar. 12, 2009, now Pat. No. 8,643,068.

(51) Int. Cl.
*H01L 27/148* (2006.01)
*H01L 29/768* (2006.01)
(Continued)

(52) U.S. Cl.
CPC ...... *H01L 21/823412* (2013.01); *H01L 21/266* (2013.01); *H01L 21/26513* (2013.01); *H01L 21/823807* (2013.01); *H01L 27/088* (2013.01); *H01L 29/105* (2013.01); *H01L 29/66537* (2013.01); *H01L 29/78* (2013.01)

(58) Field of Classification Search
CPC ............ H01L 29/7815; H01L 29/7813; H01L 29/7803; H01L 29/7827
See application file for complete search history.

(56) References Cited

U.S. PATENT DOCUMENTS 5,021,845 A    6/1991  Hashimoto
6,084,264 A    7/2000  Darwish
(Continued)

FOREIGN PATENT DOCUMENTS

CN    1334606    2/2002
DE    10239862   3/2007

OTHER PUBLICATIONS

Doolittle, Alan. "Lecture 5 Ion Implantation". Lecture power point for ECE 6450 at Georgia Tech. 2006. http://web.archive.org/web/20060907011728/http://users.ece.gatech.edu/~alan/ECE6450/Lectures/ECE6450L5-ion%20implantation.pdf.*
Office Action mailed Jun. 13, 2011 in U.S. Appl. No. 12/402,943.
Final Office Action mailed Mar. 12, 2013 in U.S. Appl. No. 12/402,943.

*Primary Examiner* — Hoai V Pham
(74) *Attorney, Agent, or Firm* — Dicke, Billig & Czaja, PLLC

(57) ABSTRACT

An integrated circuit having field effect transistors and manufacturing method. One embodiment provides an integrated circuit including a first FET and a second FET. At least one of source, drain, gate of the first FET is electrically connected to the corresponding one of source, drain, gate of the second FET. At least one further of source, drain, gate of the first FET and the corresponding one further of source, drain, gate of the second FET are connected to a circuit element, respectively. A dopant concentration of a body along a channel of each of the first and second FETs has a peak at a peak location within the channel.

10 Claims, 7 Drawing Sheets

(51) Int. Cl.
 *H01L 21/8234* (2006.01)
 *H01L 21/265* (2006.01)
 *H01L 21/266* (2006.01)
 *H01L 21/8238* (2006.01)
 *H01L 27/088* (2006.01)
 *H01L 29/10* (2006.01)
 *H01L 29/66* (2006.01)
 *H01L 29/78* (2006.01)

(56) References Cited

U.S. PATENT DOCUMENTS

| | | |
|---|---|---|
| 6,154,012 A | 11/2000 | Drori |
| 6,498,376 B1 | 12/2002 | Miyagi et al. |
| 6,720,616 B2 | 4/2004 | Hirler et al. |
| 2005/0205962 A1 | 9/2005 | Hirler et al. |
| 2009/0039869 A1* | 2/2009 | Williams .................. 324/123 R |

* cited by examiner

METHOD OF MANUFACTURING AN INTEGRATED CIRCUIT HAVING FIELD EFFECT TRANSISTORS INCLUDING A PEAK IN A BODY DOPANT CONCENTRATION

CROSS-REFERENCE TO RELATED APPLICATIONS

This Utility Patent Application is a divisional application of U.S. application Ser. No. 12/402,943, filed Mar. 12, 2009, which is incorporated herein by reference.

BACKGROUND

A variety of semiconductor applications such as semiconductor power switches include circuit parts for diagnostic functions and protection functions. Such circuit parts may include field effect transistors (FETs) electrically connected to each other. By way of example, one of these FETs may be used to sense electrical characteristics of the other one these FETs.

There is a need for an integrated circuit having FETs with matched threshold voltages.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides an integrated circuit including a first FET and a second FET, wherein at least one of source, drain, gate of the first FET is electrically connected to the corresponding one of source, drain, gate of the second FET, and wherein at least one further of source, drain, gate of the first FET and the corresponding one further of source, drain, gate of the second FET are connected to a circuit element, respectively. A dopant concentration of a body along a channel of each of the first and second FETs of the integrated circuit has a peak at a peak location within the channel.

One embodiment provides a method of manufacturing an integrated circuit. A first FET and a second FET are formed, wherein at least one of source, drain, gate of the first FET is electrically connected to the corresponding one of source, drain, gate of the second FET, and wherein at least one further of source, drain, gate of the first FET and the corresponding one further of source, drain, gate of the second FET are connected to a circuit element, respectively. The formation of the first and second FETs according to one method further includes forming a body of each of the first and second FETs having a dopant concentration along a channel of the respective FET that includes a peak at a peak location within the channel.

Figure 1:
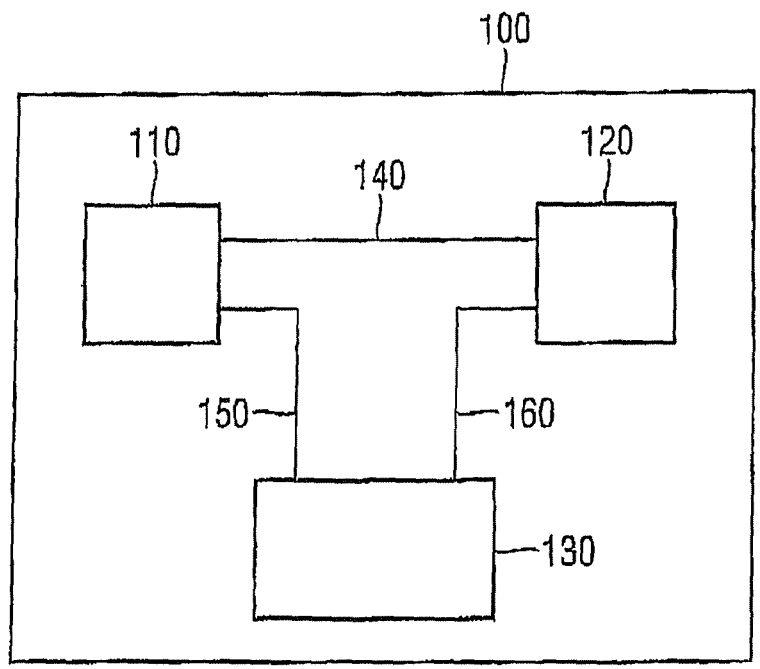
FIG. 1 illustrates a simplified schematic view of an integrated circuit including a first FET, a second FET and a circuit element interconnected with each other in accordance with one embodiment.

Referring to FIG. 1 an integrated circuit 100 includes a first FET 110 and a second FET 120, wherein at least one of source, drain, gate of the first FET 110 is electrically connected to the corresponding one of source, drain, gate of the second FET 120. The connection between the first FET 110 and the second FET 120 may be a connection line 140 such as a line of conductive material, e.g., a metal line. The connection between the at least one of source, drain, gate of the first FET 110 and the corresponding one of source, drain, gate of the second FET 120 may also include further circuit devices, e.g., resistors, provided that an electrical signal applied to the at least one of source, drain, gate of the first FET 110 equals the electrical signal at the corresponding one of source, gate, drain of the second FET 120.

At least one further of source, drain, gate of the first FET 110 and the corresponding one further of source, drain, gate of the second FET 120 are connected to a circuit element 130, respectively. The first FET 110 may be connected to the circuit element 130 via a first connection line 150 and the second FET 120 may be connected to the circuit element 130 via a second connection line 160. Each of the first and second connection lines 150, 160 may be conductive lines such a metal lines and may also include further active or passive circuit devices. Circuit element 130 is configured to process both electrical signals provided from the first and second FETs 110, 120, respectively, as input signals. By way of example, circuit element 130 may be an operational amplifier, the first FET 110 may be a power FET such as a power DMOS (Double-diffused Metal Oxide Semiconductor) FET and the second FET 120 may be a sense FET such as a DMOS having an area that is smaller than the area of the power FET 110, the sense FET 120 being configured to sense electrical characteristics of the power FET 110. By way of example, the second FET 120 may be part of a cell array of the first FET 110. In this case, the one further of source, drain, gate of the first FET 110 may be electrically separated from the corresponding one further of source, drain, gate of the second FET 120.

Furthermore, a dopant concentration of a body along a channel of each of the first and second FETs 110, 120 has a peak at a peak location within the channel (not illustrated in FIG. 1). The term peak of a dopant concentration of the body at a peak position along the channel refers to a body dopant concentration having a value at the peak location which is larger or at least equal to any value of the body dopant concentration, i.e. the body dopant profile, outside of the channel such as in an extension region of the body profile into any of source, drift region, drain, for example. The peak location may also be a plateau of the dopant concentration along the channel.

According to one embodiment, the dopant concentration of the body of each of the first and second FETs 110, 120 is declining along the channel from the peak location to a pn junction between body and source of the respective one of FETs 110, 120.

According to one embodiment, the dopant concentration of the body of each of the first and second FETs 110, 120 is constant along the channel between a pn junction between body and source and the peak location within the channel, the dopant concentration declining from the peak location to the drain. The dopant concentration may form a plateau along part of the channel.

A fraction of a channel area of each of the first and second FETs 110, 120 having a dopant concentration of the body of at least 95% of a value at the peak location to an overall channel area of the respective FET is at least 15%. In other words, a fraction of the channel length having a body dopant concentration of less than 95% of a value at the peak location is less than 85% of the overall channel length.

The dopant concentration of the body of each of the first and second FETs 110, 120 may also have multiple peaks along the channel, e.g., peaks having a same maximum dopant concentration.

According to one embodiment, the dopant concentration of the body of each of the first and second FETs 110, 120 may have a single peak along the channel, the dopant concentration declining to both ends of the channel in the direction of source and drain, respectively.

By adjusting the dopant concentration of the body of the first and second FETs 110, 120 as elucidated above, a beneficial matching of threshold voltages of the first and second FETs 110, 120 may be achieved.

Figure 2:
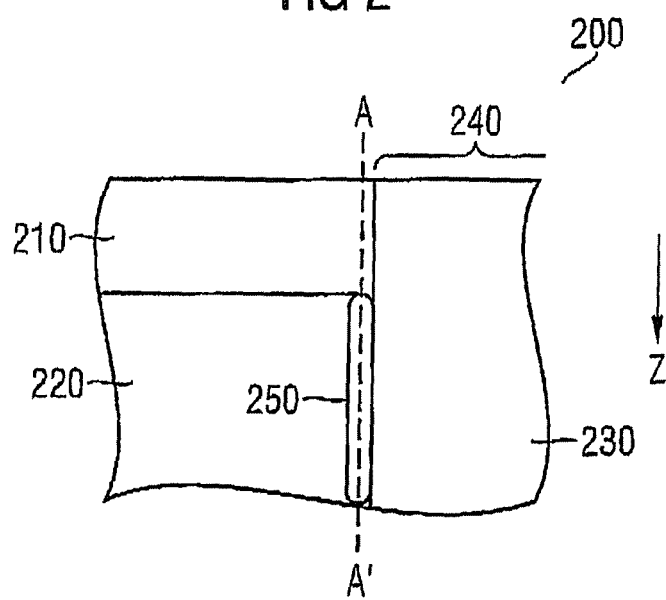
FIG. 2 illustrates a schematic cross-sectional view of a semiconductor substrate including a channel region of a trench FET.

FIG. 2 illustrates a schematic cross-sectional view of a semiconductor substrate 200 of an integrated circuit according to an embodiment. The semiconductor substrate 200 includes a trench FET having a source 210, a body 220 and a gate structure 230 formed within a trench 240 of the semiconductor substrate 200. The trench 240 extends into the semiconductor substrate 200 along a direction z.

The trench FET furthermore includes a channel 250. A dopant concentration of the body 220 along the channel 250 has a peak location within the channel 250, i.e. an extension of the dopant profile of the body 220 from the channel region 250 into the source 210 along an interface between source 210 and gate structure 230 may only include values of the dopant concentration equal to or below the value at the peak location along the channel.

Figure 3:
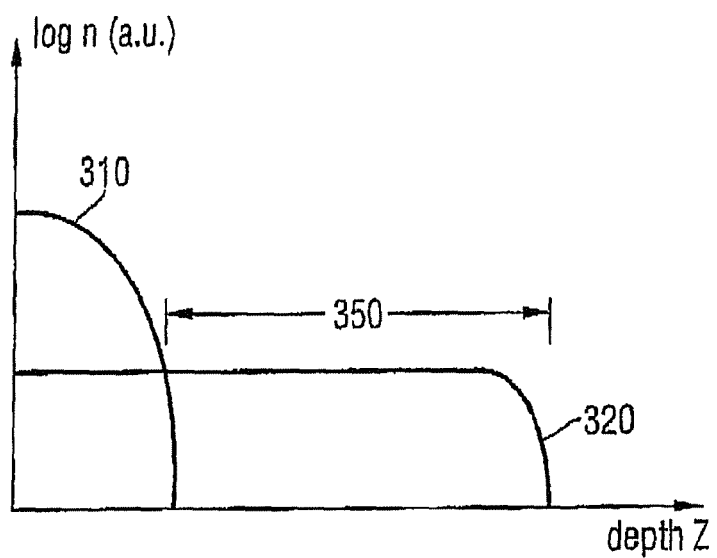
FIG. 3 is a schematic illustration of a dopant concentration of a body along a channel of each of the first and second trench FETs of the integrated circuit according to one embodiment.

FIG. 3 is a schematic illustration of the dopant concentration of a body 320 along a channel 350 of at least one of the first trench FET and the second trench FET according to one embodiment. For illustration purposes also the dopant concentration of a source 310 is illustrated in FIG. 3. The profile of the dopant concentration of the body 320 along the channel 350 is a box-like dopant profile. The box-like dopant profile of the body 320 may be formed by implanting dopants at different implant energies resulting in a plurality of implant peaks at different depths z within the semiconductor substrate. By heating up the semiconductor substrate, the implanted dopants may diffuse and the shape of the overall dopant concentration of the body may become or approach a box-like dopant profile such as the one illustrated in FIG. 3.

Figure 4:
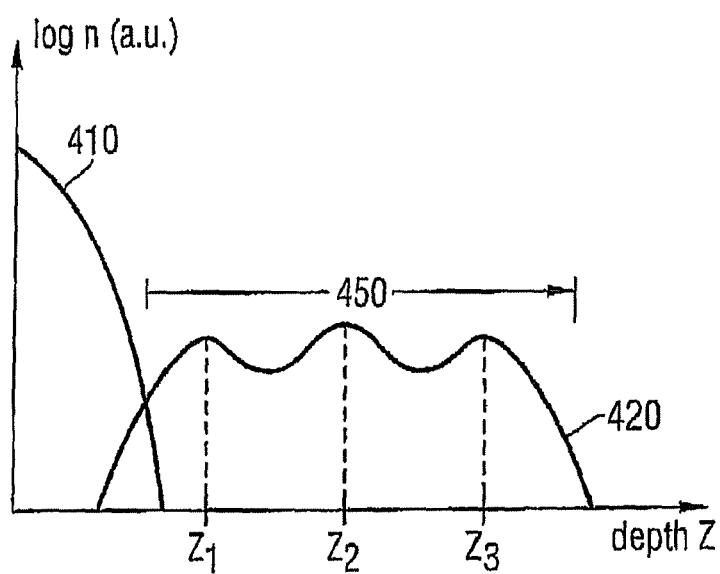
FIG. 4 is a schematic illustration of a dopant concentration of a body along a channel of each of the first and second trench FETs of the integrated circuit according to one embodiment.

Referring to FIG. 4, the dopant concentration of the body along the channel of at least one of the first and second trench FETs is schematically illustrated. Similar to the profile illustrated in FIG. 3, the profile illustrated in FIG. 4 is also formed by implanting dopants at different implant energies. With regard to the profile illustrated in FIG. 4, dopants are implanted into the semiconductor substrate at three different implant energies leading to three implant peaks at depths, $z1$, $z2$, $z3$. The higher the implant energy, the larger the depth z of the implant peak is within the semiconductor substrate.

Thus, the implant energy of the dopants implanted up to the depth $z3$ is higher than the implant energy used to implant the dopants up to the depth $z2$ and the implant energy used to introduce the dopants into the semiconductor substrate up to the depth $z2$ is higher than the implant energy used to introduce the dopants into the semiconductor substrate up to the depth $z1$. Although the schematic dopant concentration profile of the body 420 illustrated in FIG. 4 is based up on implants at three different energies, a different number of implant energies and also different thermal treatments for diffusion of the implanted dopants may be used to adjust the dopant profile of the body as desired provided that the resulting dopant concentration profile has a peak at a peak location $z1$, $z2$, $z3$ within the channel 450, a peak value of the dopant concentration at the peak location $z1$, $z2$, $z3$ within the channel 450 being larger or at least equal to a highest value of the dopant concentration of the body outside of the channel 450, e.g., in an extension region of the body profile within the source.

Figure 5A:
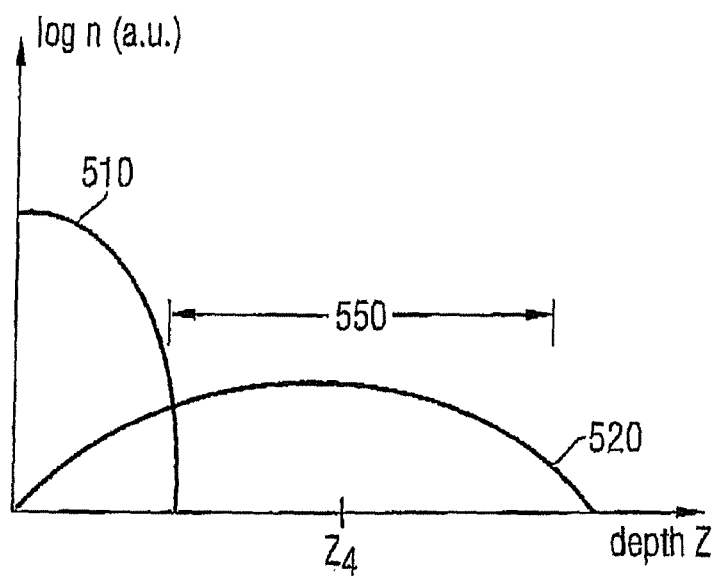
FIG. 5A is a schematic illustration of a dopant concentration of a body along a channel of each of the first and second trench FETs of the integrated circuit according to one embodiment.

FIG. 5A refers to one embodiment of a profile of the dopant concentration of the body 520 of at least one of the first and second trench FETs. The body profile 520 may be formed by implanting dopants into the semiconductor substrate at a single implant energy such that a peak of the implant profile is within the channel region 550 of the trench FET to be formed at a peak location z4. The body dopant profile 520 in FIG. 5 is illustrated after thermal treatment of the semiconductor substrate resulting in a diffusion of the implanted dopants. One embodiment of a dopant concentration of a source 510 is also illustrated.

Figure 5B:
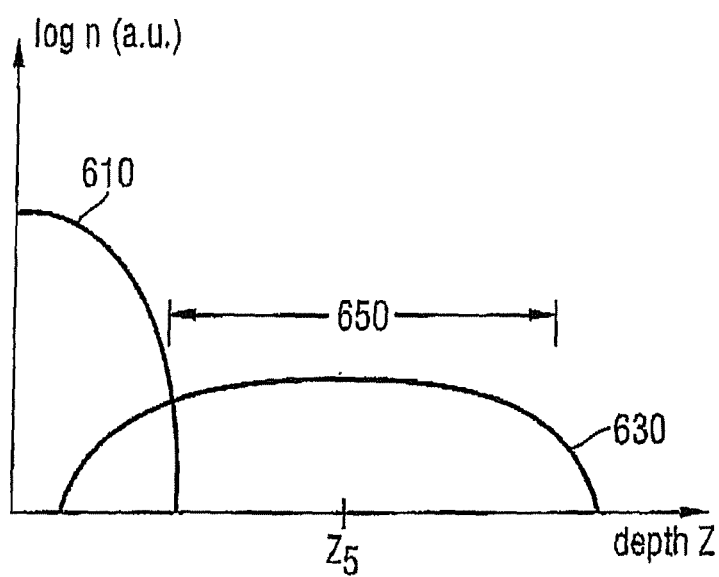
FIG. 5B is a schematic illustration of a dopant concentration of a body along a channel of each of the first and second trench FETs of the integrated circuit according to one embodiment.

Referring to FIG. 5B, the profile of the dopant concentration of the body 630 of at least one of the first and second trench FETs is illustrated along the channel 650 according to yet another embodiment. The profile of the dopant concentration of the body 630 reveals a peak value at a peak location z5 within the channel 650. In comparison with body profile 520 illustrated in FIG. 5, body profile 630 may be formed by a higher number of implants at different energies and/or by a lower temperature budget for diffusing the implanted dopants. One embodiment of a dopant concentration of a source 610 is also illustrated.

In comparison with body profile 320 illustrated in FIG. 3, body profile 630 may be formed by a lower number of implants at different energies.

Figure 6:
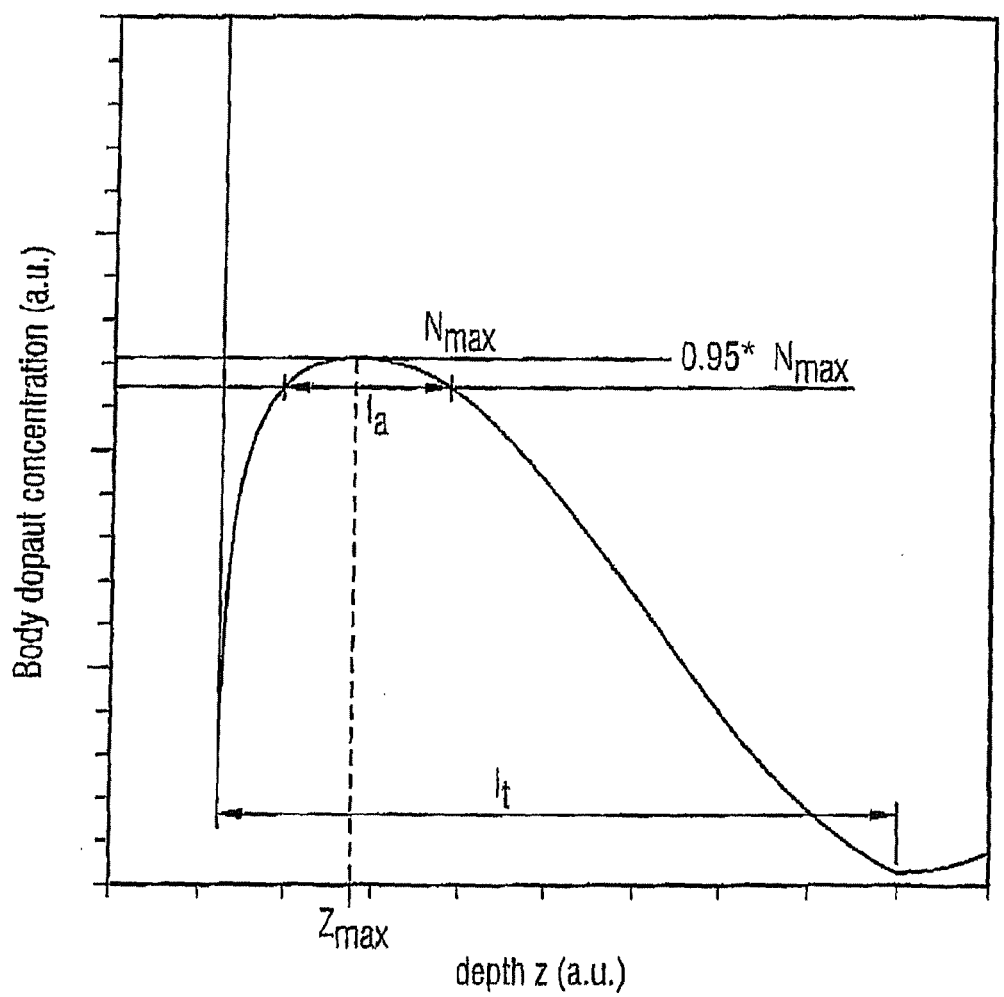
FIG. 6 is a schematic drawing of a dopant concentration of a body along a channel of each of the first and second trench FETs of the integrated circuit according to one embodiment.

Referring to FIG. 6 illustrating a body dopant concentration N versus a depth z along a channel of at least one of the first and second trench FETs according to an embodiment, a fraction of a channel length $1a$ having a body dopant concentration of at least 95% of a value Nmax at a peak location zmax is at least 15% of the overall channel length $1t$. In other words, a fraction of a channel area of each of the first and second FETs 110, 120 having a dopant concentration of the body of at least 95% of a value at the peak location to an overall channel area of the respective FET is at least 15%.

The profiles of body dopant concentrations along the channel illustrated in FIGS. 3 to 6 refer to trench FETs such as the trench FET illustrated in FIG. 2, for example. However, one or more embodiments also refer to lateral FETs.

Figure 7B:
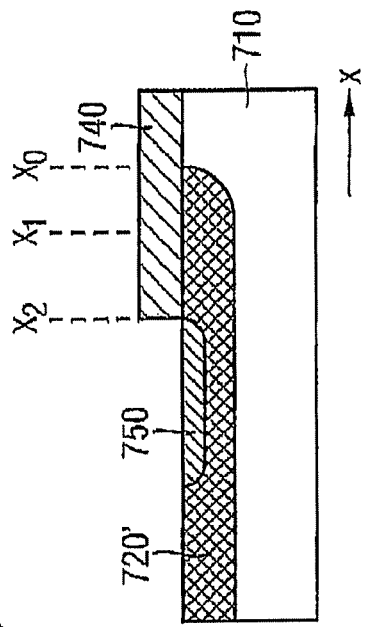
FIGS. 7A and 7B illustrate schematic cross-sectional views of a semiconductor substrate during manufacture of a first and a second lateral FET of an integrated circuit according to one embodiment.
Figure 7A:
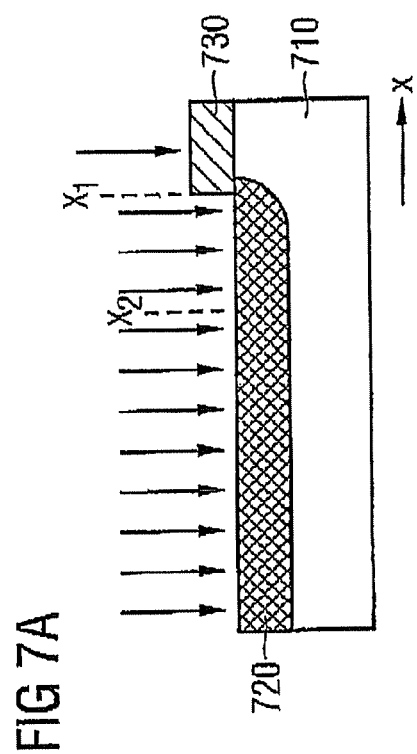

FIGS. 7A and 7B illustrate schematic cross-sectional views of a semiconductor substrate portion 710 during manufacture of an integrated circuit including a first lateral FET and a second lateral FET according to one embodiment.

In the schematic cross-sectional view of the substrate portion 710 dopants 720 are implanted into the substrate portion 710 via a mask 730. The dopants 720 define the body of the FET that is to be formed, e.g., the body of the first lateral FET or the second lateral FET.

After implant of the dopants 720 into the substrate portion 710 illustrated in FIG. 7A, a gate structure 740 is formed on the substrate portion 710 and a source 750 is formed within a body 720' defined by dopants 720 after thermal treatment. The gate structure 740 partly overlaps the body 720' along a lateral direction x between x0 and x2. The overlap between x0 and x2 may not only be ascribed to the thermal diffusion of the dopants 720 from x1 to x0 resulting from thermal treatment but is also due to partial formation of the gate structure 740 on the as-implanted dopants 720 between x2 and x1 prior to thermal treatment (cf. FIG. 7A, 7B).

Figure 8B:
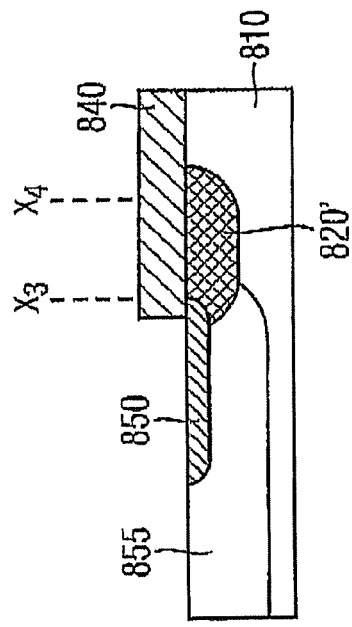
FIGS. 8A and 8B illustrate schematic cross-sectional views of a semiconductor substrate during manufacture of the first and the second lateral FET of the integrated circuit according to one embodiment.
Figure 8A:
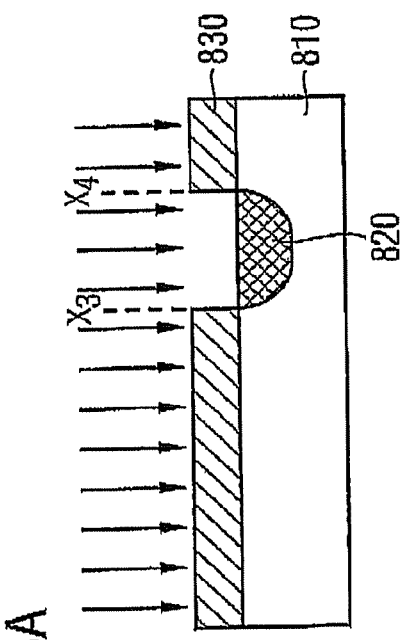

FIGS. 8A and 8B illustrate schematic cross-sectional views of a semiconductor substrate portion 810 during manufacture of an integrated circuit including a first lateral FET and a second lateral FET according to one embodiment.

In the schematic cross-sectional view of the substrate portion 810 dopants 820 are implanted into the substrate portion 810 via a mask 830. The dopants 820 define the body of the FET that is to be formed, e.g., the body of the first lateral FET or the second lateral FET.

After implant of the dopants 820 into the substrate portion 810 as illustrated in FIG. 8A, a gate structure 840 is formed on the substrate portion 810, a source 850 is formed within body region 820' defined by dopants 820 after thermal treatment and an optional further semiconductor zone 855 having a same conductivity type, i.e. p-type or n-type may be formed. The further semiconductor zone 855 may be used to electrically insulate source and drain. The gate structure 840 at least partly overlaps the body 820' along a lateral direction x at least between x3 and x4. The overlap between x3 and x4 results from an implant of body dopants in a part of a channel region later defined by gate structure 840.

Figure 9:
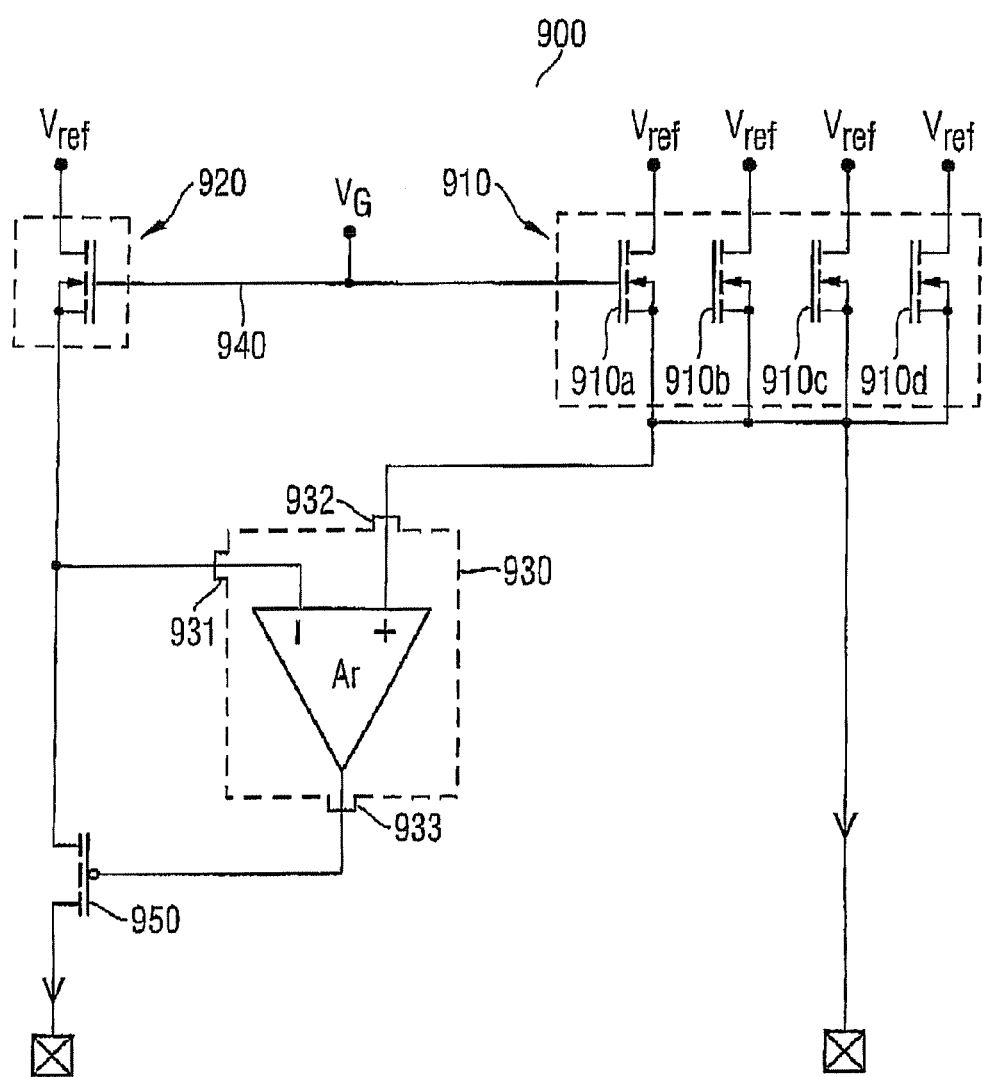
FIG. 9 is an illustration of a schematic diagram of an integrated circuit including a first FET, a second FET and a circuit element according to one embodiment.

FIG. 9 illustrates a circuit diagram of a portion of an integrated circuit 900 according to one embodiment. The integrated circuit 900 includes a power FET 910 such as a power DMOS having a plurality of FET cells 910a, 910b, 910c, 910d, . . . . The integrated circuit 900 furthermore includes a sense FET 920 such as a sense DMOS. A gate of the sense FET 920 is connected to the gate of the power FET 910 via a conductive line 940. Thus, a gate signal Vg is supplied to both the gate of the sense FET 920 and the gate of the power FET 910.

Both, the power FET 910 and the sense FET 920 include a body having a peak of a dopant concentration along the channel at a peak location within the channel. The power FET 910 may include a body having a dopant concentration along the channel as illustrated in any of the embodiments related to FIGS. 3 to 8B, for example. Furthermore, the sense FET 920 may also include a body having the dopant concentration along the channel as illustrated in any of the embodiments related to FIGS. 2 to 8B, for example.

The integrated circuit 900 furthermore includes an operational amplifier 930. One input 931 of the operational amplifier 930 is connected to a source of the sense FET 920. The other input 932 of the operational amplifier 930 is connected to the source of the power FET 910. An output 933 of the operational amplifier 930 drives a gate of a FET 950.

By using elements 930, 950 in the configuration illustrated in FIG. 9, the source voltage of the sense FET 920 may be adjusted to the source voltage of the power FET 910.

Figure 10:
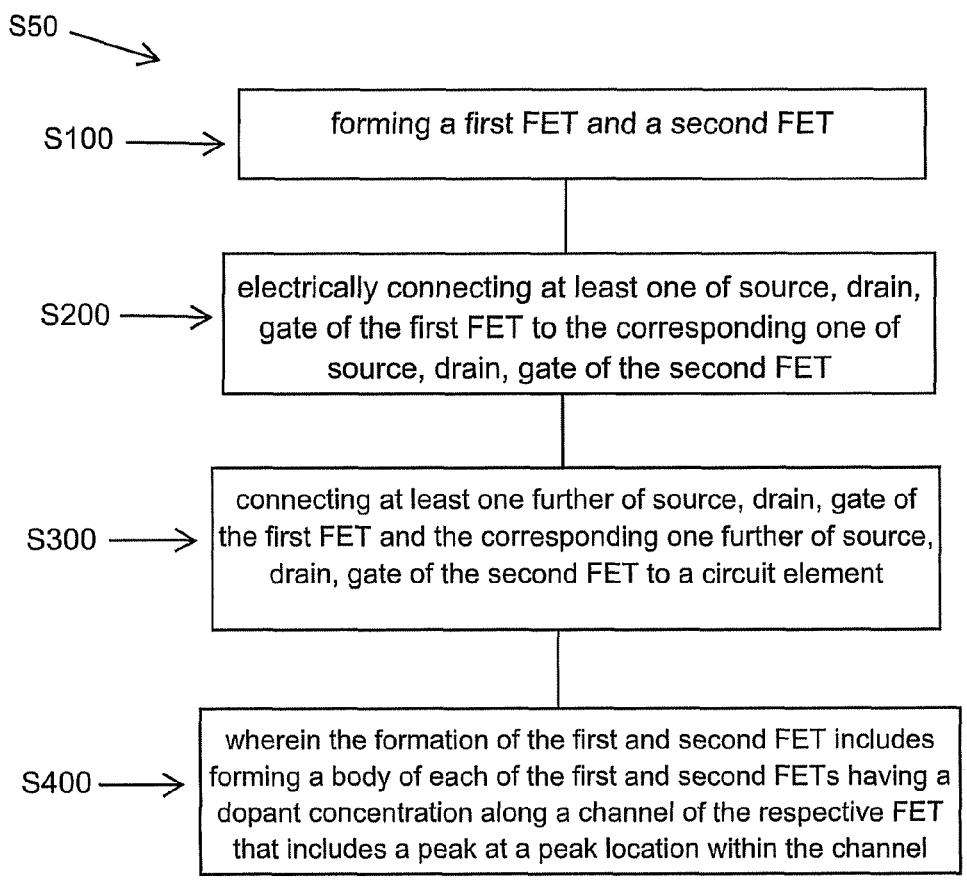
FIG. 10 illustrates a simplified flow chart of a method for manufacturing an integrated circuit according to one embodiment.

FIG. 10 is a simplified flow chart of a method for manufacturing an integrated circuit S50. At S100, a first and a second FET are formed. At S200, at least one of source, drain, gate of the first FET is electrically connected to the corresponding one of source, drain, gate of the second FET. At S300, at least one further of source, drain, gate of the first FET and the corresponding one further of source, drain, gate of the second FET are connected to a circuit element, respectively. At S400, the formation of the first and the second FET includes the formation of a body of each of the first and second FETs having a dopant concentration along a channel of the respective FET that includes a peak at a peak location within the channel.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming an integrated circuit, comprising:
    forming a first FET and a second FET;
    electrically connecting at least one of source, drain, gate of the first FET to the corresponding one of source, drain, gate of the second FET; and connecting at least one further of source, drain, gate of the first FET and the corresponding one further of source, drain, gate of the second FET to a circuit element, respectively; and wherein the formation of the first and second FET includes forming a body of each of the first and second FETs having a dopant concentration along a channel of the respective FET that includes a peak at a peak location within the channel, and further comprising forming the first and second FETs as Trench FETs comprising trenches extending into a semiconductor substrate from a first surface of the semiconductor substrate, and wherein forming the body of each of the first and second FETs includes:

implanting dopants into the semiconductor substrate such that a peak concentration of the implanted dopants has a greater distance to the first surface than a pn junction between the source and the body.

2. The method of claim 1, comprising forming the body of each of the first and second FETs includes:

implanting dopants into a semiconductor substrate and annealing implant damages such that a fraction of a channel area of each of the first and second FETs having a dopant concentration of at least 95% of a value at the peak location to an overall channel area of the respective FET is at least 15%.

3. The method of claim 1, further comprising:

forming the first FET as a power FET and forming the second FET as a sense FET having an area that is smaller than the area of the power FET.

4. The method of claim 1, further comprising:

connecting the gate of the first FET to the gate of the second FET;

connecting one of source and drain of the first FET to the corresponding one of source and drain of the second FET; and connecting the other one of source and drain of the first FET and the other one of source and drain of the second FET to the circuit element.

5. A method, comprising:

forming a first FET and a second FET, wherein the first FET is a power FET and the second FET is a sense FET;

connecting at least one of a source, drain, or gate of the first FET to the corresponding one of a source, drain, or gate of the second FET;

connecting at least one further of the source, drain, or gate of the first FET and the corresponding one further of source, drain, or gate of the second FET to a circuit element, respectively;

wherein forming the first FET and the second FET include forming a dopant concentration profile of a body along a channel of each of the first and second FETs having a peak at a peak location within the channel, wherein a value of the dopant concentration profile of the body at the peak location of each of the first and second FETs is larger or at least equal to any value of the dopant concentration profile of the body in an extension region that extends into the source, wherein the dopant concentration profile of the body of the first FET and the dopant concentration profile of the body of the second FET follow substantially similar contours along the channel of the first and second FETs respectively, and further comprising forming the first and second FETs as Trench FETs comprising trenches extending into a semiconductor substrate from a first surface of the semiconductor substrate, and wherein forming the body of each of die first and second FETs includes:

implanting dopants into the semiconductor substrate such that a peak concentration of the implanted dopants has a greater distance to the first surface than a pn junction between the source and the body.

6. The method of claim 5, wherein the dopant concentration profile of the body of each of the first and second FETs is declining along the channel from the peak location to a pn junction between the body and source.

7. The method of claim 5, wherein a fraction of a channel area of each of the first and second FETs having a dopant concentration of the body of at least 95% of a value at the peak location to an overall channel area of the respective FET is at least 15%.

8. The method of claim 5, wherein the dopant concentration profile of the body of each of the first and second FETs has a single peak within the channel, the dopant concentration profile of the body declining to both ends of the channel in the direction of source and drain.

9. The method of claim 5, wherein the gate of the first FET is connected to the gate of the second FET;

one of the source and drain of the first FET is connected to the corresponding one of the source and drain of the second FET; and wherein the other one of the source and drain of the first FET and the other one of the source and drain of the second FET are connected to the circuit element.

10. The method of claim 5, wherein the dopant concentration profile of the body of each of the first and second FETs continuously declines within the source.

* * * * *